(12) United States Patent  
Wong et al.

(10) Patent No.: US 7,888,911 B2  
(45) Date of Patent: Feb. 15, 2011

(54) METHOD AND SYSTEM FOR DETERMINING THE SOC OF A RECHARGEABLE BATTERY

(75) Inventors: Kin Pun Wong, Singapore (SG); Sung On Andrew Ng, Hong Kong (GB); Che Wee Yeo, Singapore (SG)

(73) Assignee: GP Batteries International Limited, Singapore (SG)

( * ) Notice: Subject to any disclaimer, the term of this patent is extended or adjusted under 35 U.S.C. 154(b) by 716 days.

(21) Appl. No.: 11/675,910

(22) Filed: Feb. 16, 2007

(65) Prior Publication Data

US 2008/0231238 A1 Sep. 25, 2008

Related U.S. Application Data

(63) Continuation of application No. PCT/SG2005/000283, filed on Aug. 17, 2005.

(30) Foreign Application Priority Data

Aug. 18, 2004 (SG) .............................. 200404695-9

(51) Int. Cl.  
*H02J 7/00* (2006.01)  
*H02J 7/06* (2006.01)

(52) U.S. Cl. ................... 320/132; 320/159; 320/164  
(58) Field of Classification Search ............. 320/132, 320/159, 164  
See application file for complete search history.

(56) References Cited

U.S. PATENT DOCUMENTS

| 5,557,190 A | 9/1996 | Brotto |
| 5,578,915 A | 11/1996 | Crouch, Jr. et al. |
| 5,619,118 A | 4/1997 | Reipur et al. |
| 5,808,445 A * | 9/1998 | Aylor et al. ................. 320/132 |
| 2005/0099161 A1 | 5/2005 | Sato |
| 2006/0232277 A1* | 10/2006 | Murakami et al. .......... 324/433 |

* cited by examiner

*Primary Examiner*—Edward Tso  
*Assistant Examiner*—Richard V Muralidar  
(74) *Attorney, Agent, or Firm*—Volpe and Koenig, PC

(57) ABSTRACT

A method of determining the state of charge (SOC) of a rechargeable battery, the method comprising charging the battery using a substantially constant charge current; measuring the battery temperature; and conducting a first measurement of the battery voltage at a time interval, $t_1$, from the start of the charging, and a second measurement of the battery voltage at a time interval, $t_2$, from the first measurement.

22 Claims, 6 Drawing Sheets

METHOD AND SYSTEM FOR DETERMINING THE SOC OF A RECHARGEABLE BATTERY

CROSS REFERENCE TO RELATED APPLICATION

This application is a continuation of PCT/SG2005/000283, filed Aug. 17, 2005, which is incorporated by reference as if fully set forth.

FIELD OF INVENTION

The present invention relates broadly to a method and system for determining the state of charge (SOC) of a rechargeable battery.

BACKGROUND

The use of batteries as an alternative source of energy is promoted in a variety of applications, including in the automotive industry. At the same time, there are a number of challenges that currently inhibit a large scale implementation of batteries as an alternative source of energy in industry, in particular in the automotive industry. Those challenges include both technical problems and challenges in overcoming an inertia in an industry which over many decades has been dominated by engine designs based on fossiled energy resources, in particular fuel and more recently gas based energy sources.

In an attempt to overcome those challenges, hybrid electric vehicles (EVs) have been proposed and are starting to be implemented commercially. Hybrid EVs, as the name suggests, utilize a conventional engine design, in conjunction with an electric motor system to supplement the conventional engine. In some designs, the electric motor may temporarily be utilized as the sole provider of the vehicles' movement under specific operational conditions.

In the design and implementation of such hybrid EVs or pure EVs, it is crucial to accurately determine the SOC of the rechargeable battery during the continued use of the hybrid EV. Typically, the SOC is monitored via on-board monitoring circuitry, which effectively integrates the continuous charge and discharging capacities of the battery in operation.

However, it has now been recognized that such circuitry can only provide sufficiently accurate data and over a sufficiently long period of time under non-critical operating conditions. Such non-critical conditions refer to the operation of the electric motor at e.g. constant speeds, and during slow or moderate accelerations and decelerations. Also, it has been recognized that the battery charge and discharge characteristics and performances are greatly affected by the environmental conditions, such as temperature and pressure, during the operation or use of the battery.

The reliance on such non-critical operating conditions is not satisfactory for many applications, including the application in hybrid EVs. In such applications, the operation conditions often include the use of the electric motor under high acceleration conditions, in particular at high initial mechanical impulse, such as quick start, overtaking on a freeway, or during steep inclines. For such operating conditions, the monitoring of the SOC of the rechargeable battery in an accurate manner is crucial, to reduce or eliminate the risk of polarity reversal or over discharge of a rechargeable battery. Also, when a cruising hybrid EV or pure EV is braked, large amount of kinetic energy will be converted to electrical energy when regenerative braking is applicable, for fast charging the batteries. Risk of over charging may occur if correct SOC is not known.

In at least preferred embodiments, the present invention seeks to address one or more of the above mentioned concerns in relation to the determination of the SOC of a rechargeable battery.

SUMMARY

In accordance with a first aspect of the present invention there is provided a method of determining the state of charge (SOC) of a rechargeable battery, the method comprising charging the battery using a substantially constant charge current; measuring the battery temperature; and conducting a first measurement of the battery voltage at a time interval, $t_1$, from the start of the charging, and a second measurement of the battery voltage at a time interval, $t_2$, from the first measurement.

In one embodiment, $t_1$ may be chosen such a substantially stable behavior in a charging characteristic of the battery at the charge current is reached before the first voltage measurement.

In one embodiment, $t_1$ and $t_2$ may be chosen such that the second voltage measurement is prior to reaching a substantially unstable behavior in the charging characteristic before a maximum charging voltage is reached.

In one embodiment, $t_1$ and $t_2$ may be calculated from different percentages of C/I, wherein C is a nominal capacity of the battery and I is the charge current.

In one embodiment, $t_1$ may be about 2% of C/I, and $t_2$ may be about 10% of C/I.

The battery may comprise a Nickel Metal Hydride Battery, a Nickel Cadmium Battery, a Lead Acid Battery, a Nickel Zinc Battery, or a Lithium Rechargeable Battery.

The method may further comprise calibrating an on-vehicle SOC integrator circuit of a hybrid EV or pure EV based on the determined SOC.

The method may comprise determining a first SOC value based on a voltage increase measured between the first and second voltage measurements, determining a second SOC value based on the voltage measured at the second voltage measurement, and applying a weighted averaging processing to obtain the SOC from the first and second SOC values.

The measuring of the battery voltage and the battery temperature may comprise utilizing on-vehicle gauges of a hybrid EV or pure EV and/or external gauges.

The charging of the battery may comprise utilizing an external current source and/or an on-vehicle current source for provision of the substantially constant charge current.

The battery temperature may be measured at the time of the first voltage measurement and/or at the time of the second voltage measurement.

In accordance with a second aspect of the present invention there is provided a system for determining the state of charge (SOC) of a rechargeable battery, the system comprising a source for charging the battery using a substantially constant charge current; a measurement unit for measuring the battery temperature and for conducting a first measurement of the battery voltage at a time interval, $t_1$, from the start of the charging, and a second measurement of the battery voltage at a time interval, $t_2$, from the first measurement.

In one embodiment, $t_1$ may be chosen such a substantially stable behavior in a charging characteristic of the battery at the charge current is reached before the first voltage measurement.

In one embodiment, $t_1$ and $t_2$ may be chosen such that the second voltage measurement is prior to reaching a substantially unstable behavior in the charging characteristic before a maximum charging voltage is reached.

In one embodiment, $t_1$ and $t_2$ may be calculated from different percentages of C/I, wherein C is a nominal capacity of the battery and I is the charge current.

In one embodiment, $t_1$ may be about 2% of C/I, and $t_2$ may be about 10% of C/I.

The battery may comprise a Nickel Metal Hydride Battery, a Nickel Cadmium Battery, a Lead Acid Battery, a Nickel Zinc Battery, or a Lithium Rechargeable Battery.

The system may comprise a processor unit for determining a first SOC value based on a voltage increase measured between the first and second voltage measurements, determining a second SOC value based on the voltage measured at the second voltage measurement, and applying a weighted averaging processing to obtain the SOC from the first and second SOC values.

The measurement unit may comprise on-vehicle gauges of a hybrid EV or pure EV and/or external gauges.

The source may comprise a current source external to a hybrid EV or pure EV.

The source may comprise an on-vehicle current source.

The measurement unit may measure the battery temperature at the time of the first voltage measurement and/or at the time of the second voltage measurement.

BRIEF DESCRIPTION OF THE DRAWINGS

Embodiments of the invention will be better understood and readily apparent to one of ordinary skill in the art from the following written description, by way of example only and in conjunction with the drawings, in which.

DETAILED DESCRIPTION

Figure 1:
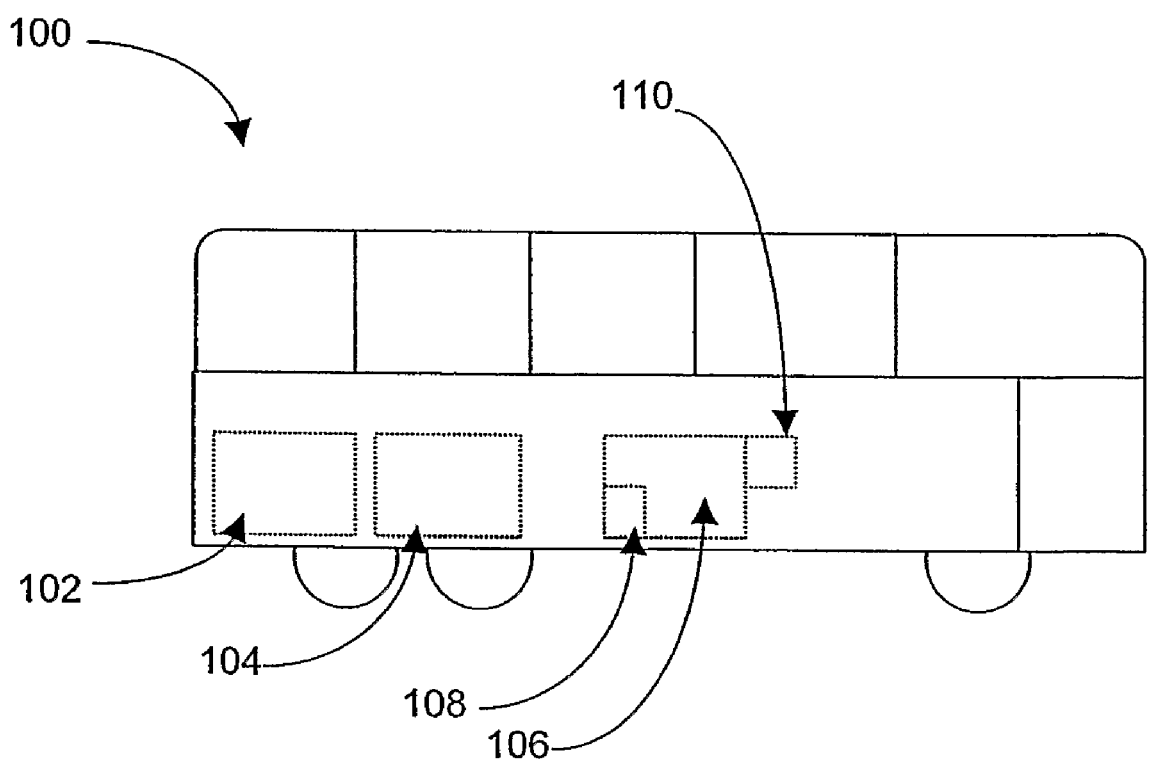
FIG. 1 is a schematic drawing of a hybrid EV according to an embodiment of the invention.

FIG. 1 shows a schematic drawing of a series or parallel hybrid EV (HEV) in the form of a HEV 100. The HEV 100 comprises both a conventional engine system 102, which may be fuel or gas based and an electric motor system 104. A battery pack 106 is also provided which houses a plurality of appropriately interconnected rechargeable battery modules e.g. 108.

The HEV 100 further comprises an on-board SOC monitoring circuit 110 of a conventional integrator type. That is, the circuit 110 continuously integrates the charging and draining capacities of the battery modules e.g. 108 during operation of the HEV 100.

In the example embodiment, in order to ensure that the on-board circuit 110 provides sufficient accuracy during operation, a periodic SOC determination procedure is conducted. Based on the determination procedure of the example embodiment, the details of which will be described below, the parameters utilized in the conventional on-board circuit 110 are periodically calibrated/adjusted, to ensure continued accuracy during the operational life of the battery modules e.g. 108. It is desirable to provide larger life times of the battery modules e.g. 108, and as an example many battery manufacturing companies are providing guaranteed life times in access of 5 years.

In the example embodiment, the SOC determination process is conducted periodically with a higher frequency during a first use period of the batteries e.g. 108, and decreasing frequency over the life of the battery modules e.g. 108.

The method of determining SOC of the rechargeable battery modules e.g. 108 in the example embodiment comprises charging the battery with a substantially constant charge current and monitoring the terminal voltage of the battery at two different charging times.

Figure 2:
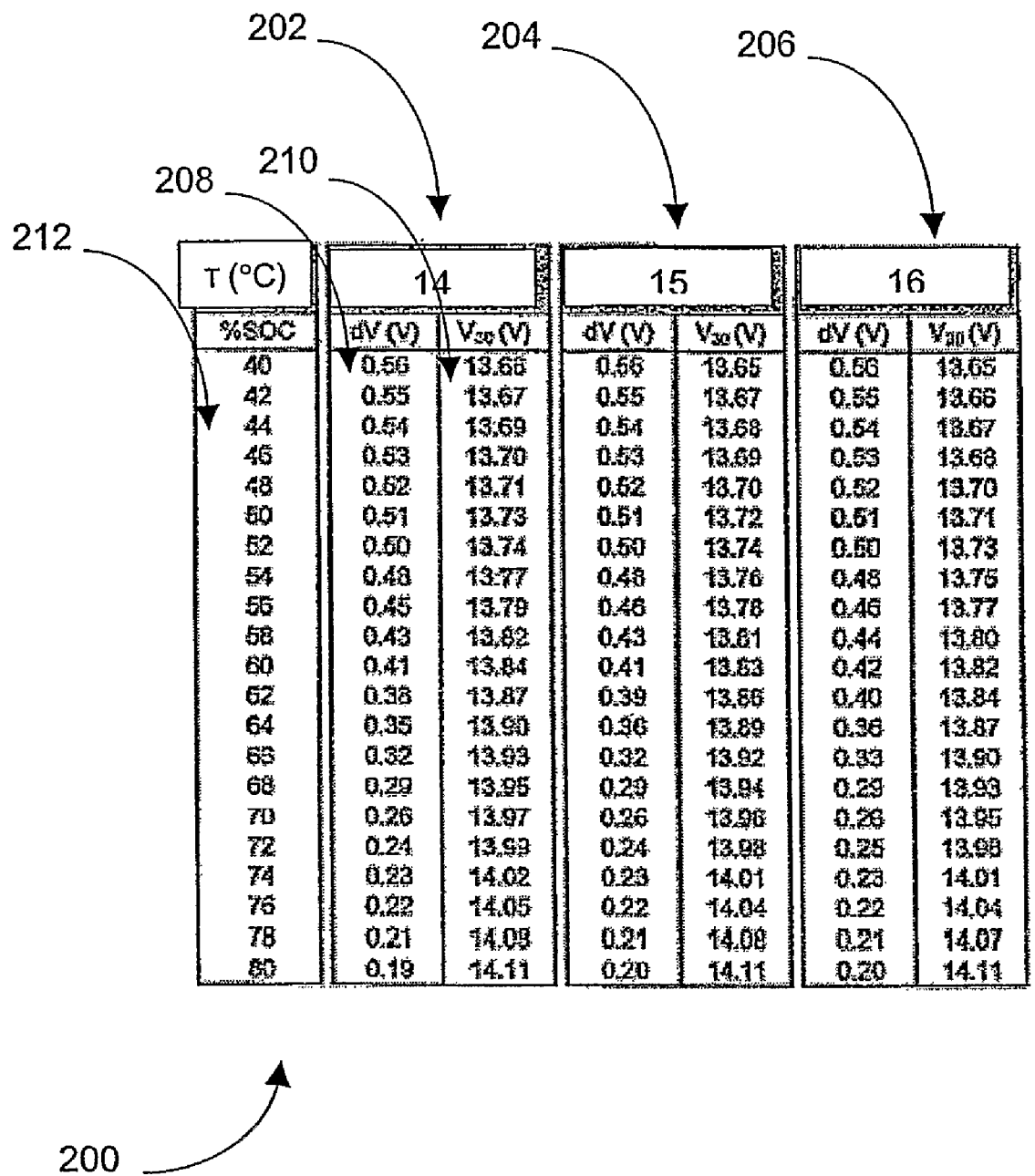
FIG. 2 shows a table illustrating gathered data for implementation of a method for determining the SOC of a rechargeable battery according to an embodiment of the invention.

FIG. 2 shows a table illustrating the gathered data for three different battery temperatures in respective columns 202, 204 and 206. The temperatures are the temperatures measured at the time of the second voltage measurement (or end of charging time) in the example embodiment. Each column e.g. 202, shows in one part column e.g. 208 the voltage difference measured between the first and second voltage measurements. The other part column e.g. 210 shows the battery voltage measured at the second voltage measurement. In the example embodiment, the first voltage measurement is conducted at 5 minutes from the start of the charging, and the second voltage measurement is conducted 25 minutes after the first voltage measurement. That is, in the example embodiment a total of thirty minutes of charging with a substantially constant charge current of 16A is applied. Table 200 illustrates the correlation of different SOCs (column 212) of the rechargeable batteries to the measured parameters at different battery temperatures (columns 202, 204, and 206). Table 200 provides complete empirical characteristics for SOC determination in the example embodiment.

More particularly, one is able to obtain two battery SOC values from the measurements: A first SOC value from the voltage increase (see e.g. part column 208) measured between the first and second voltage measurements, and a second SOC value from the battery voltage (see e.g. part column 210) measured at the second voltage measurement. In the example embodiment, these two SOC values are subjected to a weighted averaging process. The weighting takes into account, in the example embodiment, different regions in the characteristics of the measured voltage increase and the voltage measured at the second voltage measurement respectively as a function of battery SOC values, as will be described in more detail below with reference to FIG. 4. It was found that it was possible to determine the SOC of the battery to an accuracy of about ±5%. The data shown in table 200 is for a 12 V NiMH (Nickel Metal Hydride) battery.

In the example embodiment, the times for the first and second voltage measurements are chosen with reference to the maximum charging time for the battery at the constant charging current during the measurements. For example, the first measurement would be taken at a time interval, after starting the charging, corresponding to 2% of the maximum charging time. The second measurement is taken after at a time interval, after the first voltage measurement, corresponding to 10% of the maximum charging time. It will, however, be appreciated by a person skilled in the art that the particular choice of the time intervals may be varied in different embodiments and/or different batteries, and/or different environmental conditions. It was found that one may balance between the time needed for conducting the relevant measurements, versus a desired accuracy of the obtained data.

Figure 3:
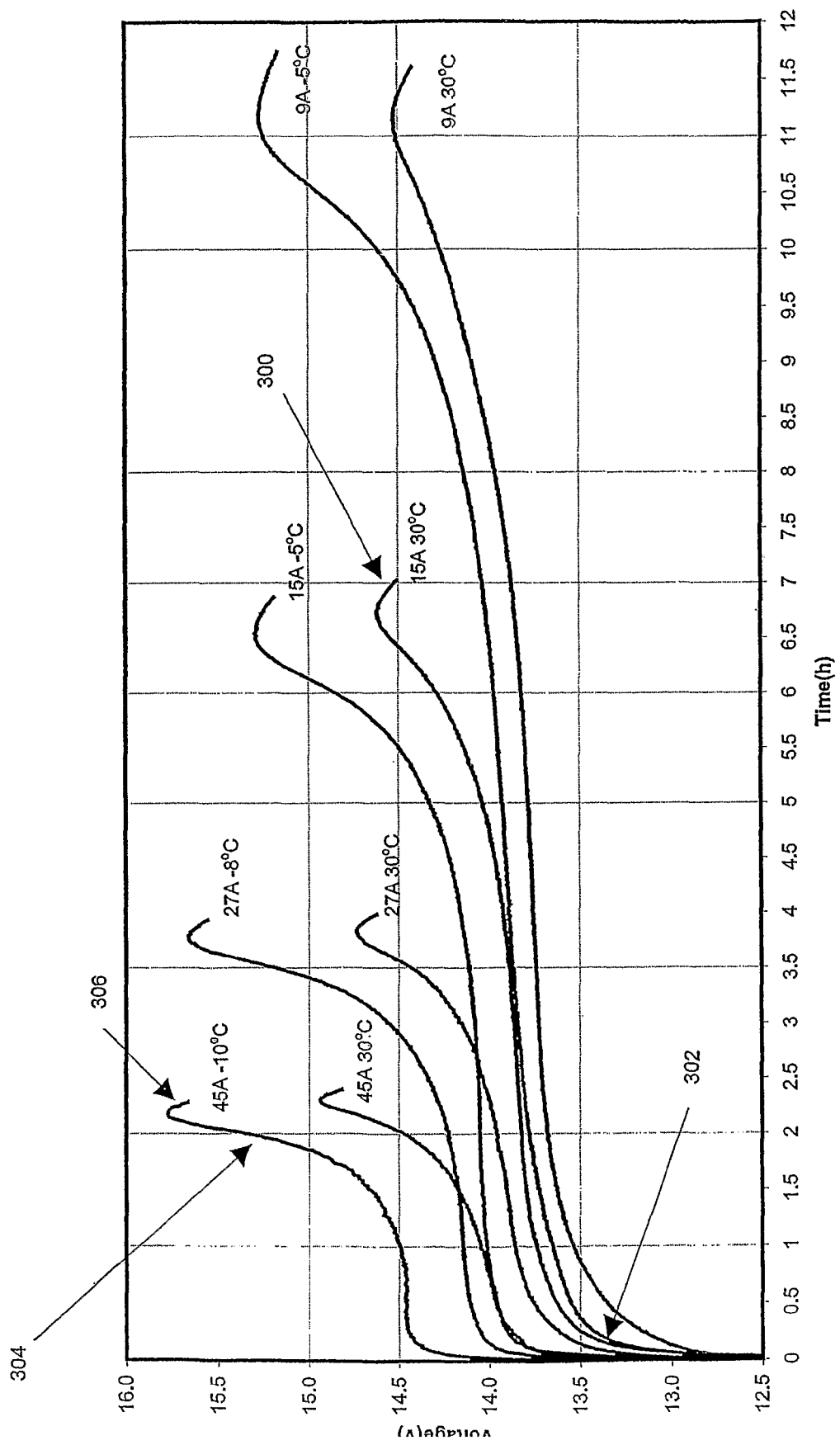
FIG. 3 shows the plots illustrating constant current charge characteristics of a rechargeable battery at different temperatures and currents, in an example embodiment of the invention.

Generally, it was found that a stable behavior of the change in the battery voltage during charging may occur between about 30% and 80% SOC. To further illustrate this point, FIG. 3 shows example measured constant current charging characteristics of a 10/GP90EVH battery module at different temperatures, starting from an open circuit voltage of 12V. For example, curve 300 shows the constant current charging characteristics at a charging current of 15A, at 30° C. As evident from curve 300, it may be desirable in the example embodiment to not conduct the voltage measurements during the initial region of unstable behavior indicated at 302. Similarly, it may be desirable to not conduct the voltage measurements in the region of unstable behavior towards the maximum charging voltage. This behavior is more pronounced at higher charging currents, indicated e.g. at numeral 304 for curve 306. It is expected that in the unstable regions e.g. 302 and 304, the accuracy of the obtained SOC will be decreased.

Figure 4:
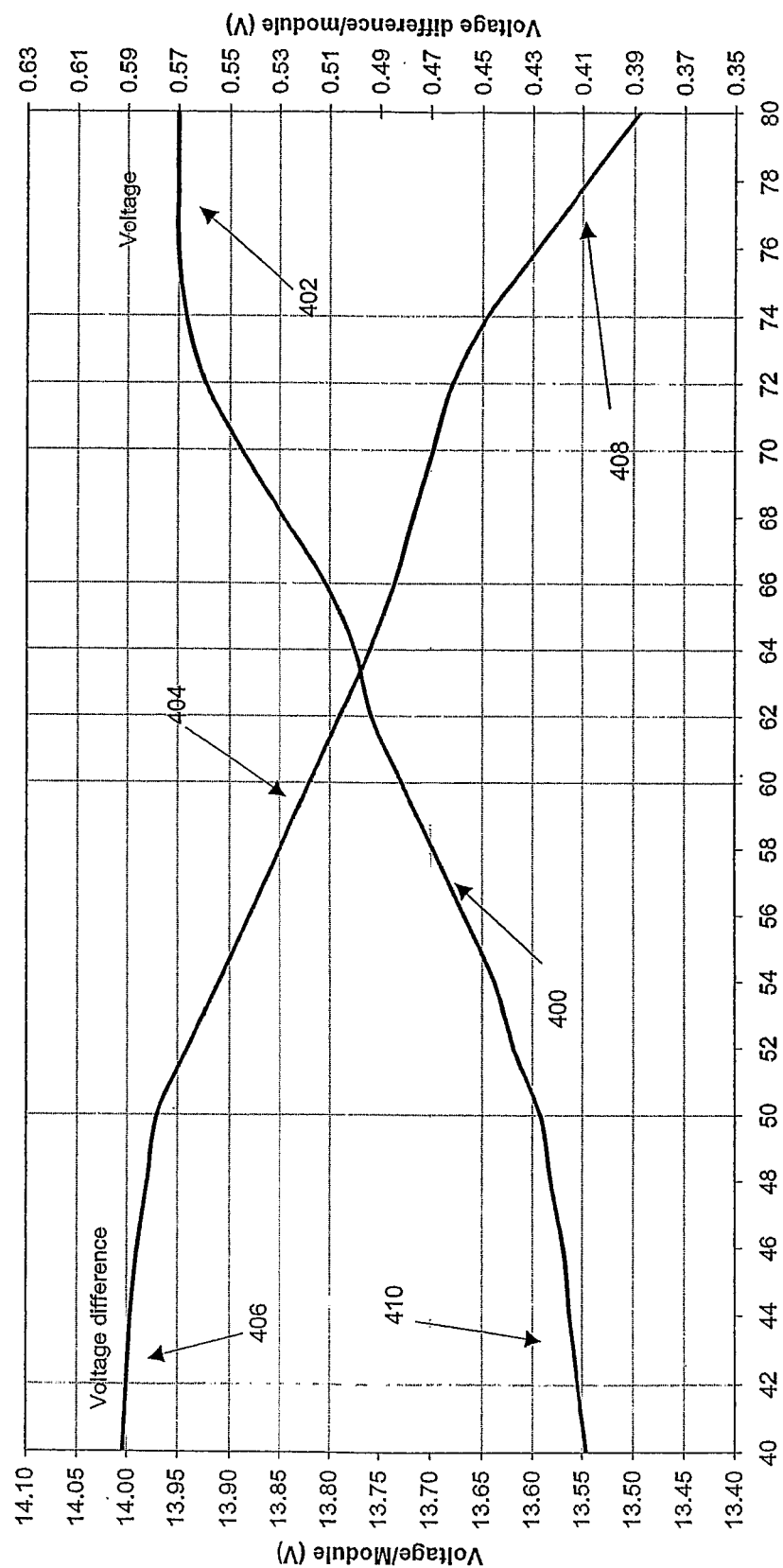
FIG. 4 shows a graph of measured terminal voltage as a function of SOC, and of measured terminal voltage difference as a function of SOC, according to an embodiment of the invention.

FIG. 4 shows a graph 400 of measured terminal voltage at the second voltage measurement point, as a function of SOC, and for a particular battery temperature (T=40° C. in the example of FIG. 4) measured at the second voltage measurement. As can be seen from FIG. 4, the graph 400 includes regions, e.g. region 402, where the relationship between the measured voltage and the SOC is such that an accurate SOC value can not be readily determined, as result of the close to zero gradient in that region. On the other hand, FIG. 4 also shows a graph 404 of the measured terminal voltage difference between the first and second voltage measurements, as a function of SOC, for the same battery temperature. It can be seen that, again, certain regions, e.g. region 406, of the graph 404 are such that the relationship between the measured voltage difference and the SOC does not allow an accurate determination of a SOC value. However, from FIG. 4 it can be seen that in those areas in which one of the graphs 400, 404 does not provide for an accurate determination of a SOC value, the other graph does (compare for example regions 402, 408 and regions 406, 410 in FIG. 4). In the example embodiment, a weighted averaging processing is applied to the two SOC values obtained from the voltage measured at the second measurement point and the measured voltage increase, which takes into account the characteristics as illustrated in FIG. 4.

Figure 5:
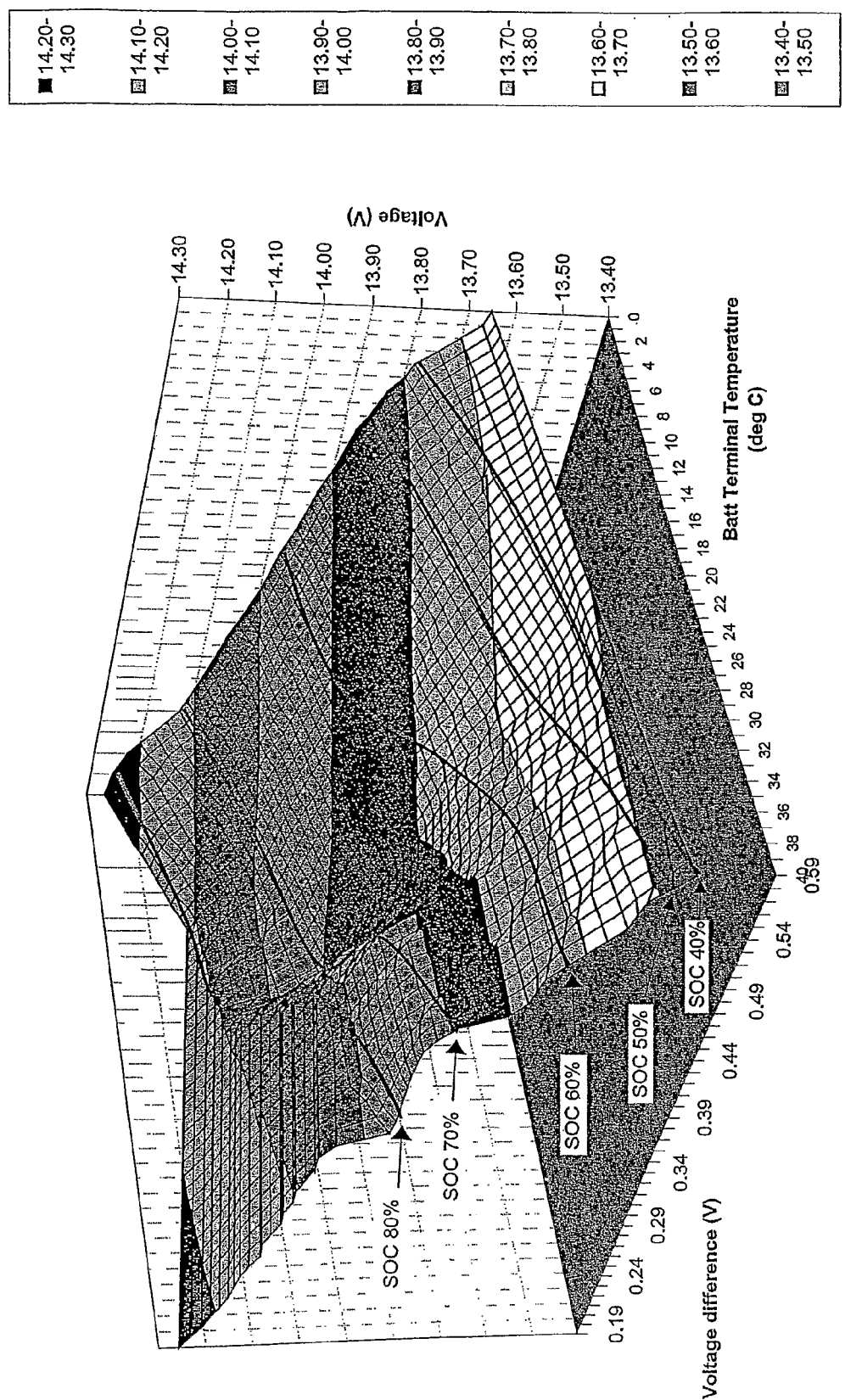
FIG. 5 shows plots illustrating SOC versus charge voltage, charge voltage difference, and battery temperature characteristics of a rechargeable battery under simulated cooling condition in an example embodiment of the invention.

FIG. 5 shows plots utilized in the determination of the complete empirical characteristics for 12V 80Ah NiMH battery in the example embodiment. A constant current (16 A), 30 minutes charge test as described above with reference to FIG. 2 was conducted, after hybrid cycle and rest under simulated field conditions. An external source and load were used to simulate the charging and draining during operation in an EV or HEV. Fans were used to simulate the cooling flow, with a 1.8 A discharge for powering the fans. The fans may operate if the battery temperature $T_{batt} \geq 25°$ C. and 2° C. above ambient temperature. A 20 mA discharge for powering a Battery Management System (BMS) was also applied.

In the example embodiment, because rechargeable batteries typically represent a dynamic system, the SOC determination procedure is instigated from a "rested" state. This state may for example be defined by a specified range of "off" period prior to the SOC determination procedures.

Returning now to FIG. 1, in the example embodiment, the relevant measurements (compare e.g. table 200) are performed manually, using external connections to the battery modules e.g. 108 for provision of constant charge current, but using on-board gauges (not shown) interconnected with the battery modules e.g. 108 and electric motor system 104. However, it will be appreciated that in different embodiments, an on-board generated charging current may be used, provided that it can be controlled accurately to be of a known, substantially constant value. This is e.g. applicable to series hybrid HEVs. Furthermore, it will also be appreciated that in different embodiments, the relevant parameters may be monitored utilizing external equipment appropriately interconnected with the battery modules e.g. 108 for facilitating implementation of the method for determination of the SOC.

Typically, the battery pack 106 of the HEV 100 may comprise a large number of battery modules e.g. 108, for example 10. In the example embodiment, a limited number of the battery modules e.g. 108 is randomly chosen for the SOC determination measurements, after filtering the highest and the lowest module voltages and defective module voltages detected for example during drive operation. If for example three battery modules are tested, the voltage measurements of the two modules that are closest to each other are used to obtain average voltage values as representative data for the battery pack 106, in the SOC determination procedure of the example embodiment.

Once the SOC has been determined utilizing the method and system of the example embodiment, the obtained information may be used to calibrate on-board circuit 110, to facilitate a continued accuracy during the operation of the HEV 100.

While the example embodiment has been described with reference to a manual gathering and analysing of the obtained data, it will be appreciated by a person skilled in the art that, in different embodiments, the method and system may be partly or fully automated. In one embodiment, the SOC determination may occur on-board and during drive operation of a parallel hybrid HEV. In a parallel hybrid HEV, there exists an operation mode in which charging of the battery occurs at a stable, i.e. constant charging current, environment, while zero drainage of the battery occurs. This is when only the engine drives the wheels. In parallel hybrid HEVs, this mode typically occurs over extended times during drive operations. In this mode, an SOC determination according to an example embodiment of the present invention may be conducted on-board and during drive operation. Such an implementation can be particularly useful for passenger cars, where it may be undesirable or inconvenient to require periodic testing at dedicated testing stations.

Figure 6:
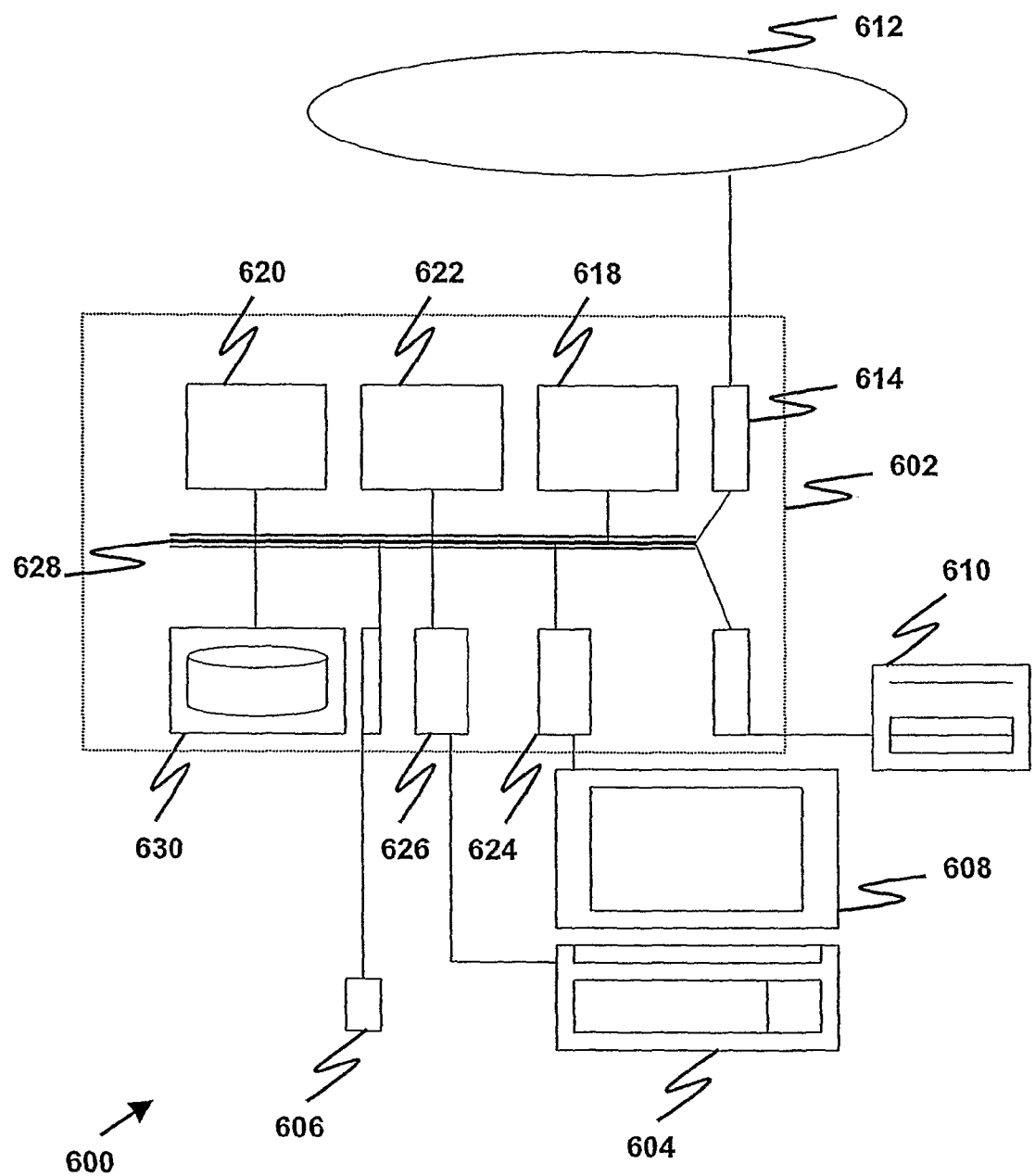
FIG. 6 is a schematic drawing illustrating a computer system for implementation of a method for determining the SOC of a rechargeable battery according to an embodiment of the invention.

The method and system of such an example embodiment can be implemented in a Battery Management System's microprocessor or on a computer system 600, schematically shown in FIG. 6. It may be implemented as software, such as a computer program being executed within the computer system 600, and instructing the computer system 600 to conduct the method of the example embodiment.

The computer system 600 comprises a computer module 602, input modules such as a keyboard 604 and mouse 606 and a plurality of output devices such as a display 608, and printer 610.

For public transport system, the computer module 602 may be connected to a computer network 612 via a suitable transceiver device 614, to enable access to e.g. the Internet or other network systems such as Local Area Network (LAN) or Wide Area Network (WAN).

The computer module 602 in the example includes a processor 618, a Random Access Memory (RAM) 620 and a Read Only Memory (ROM) 622. The computer module 602 also includes a number of Input/Output (I/O) interfaces, for example I/O interface 624 to the display 608, and I/O interface 626 to the keyboard 604.

The components of the computer module 602 typically communicate via an interconnected communication bus 628 and in a manner known to the person skilled in the relevant art.

The application program is typically supplied to the user of the computer system 600 encoded on a data storage medium such as a CD-ROM or floppy disk and read utilizing a corresponding data storage medium drive of a data storage device 630. The application program is read and controlled in its execution by the processor 618. Intermediate storage of program data maybe accomplished using RAM 620.

In the foregoing manner, methods and systems for determining the SOC of a rechargeable battery are disclosed. Only several embodiments are described. However, it will be apparent to one skilled in the art in view of this disclosure that numerous changes and/or modifications may be made without departing from the scope of the invention.

The invention claimed is:

1. A method of determining the state of charge (SOC) of a rechargeable battery, the method comprising
    charging the battery using a substantially constant charge current, wherein the battery has an unknown SOC at the commencement of the charging;
    measuring a battery temperature;
    conducting a first measurement of the battery voltage at a time interval, $t_1$, from the start of the charging, and a second measurement of the battery voltage at a time interval, $t_2$, from the first measurement, and
    determining the SOC of the battery based on the charge current, the battery temperature and the first and second measurements.

2. The method as claimed in claim 1, wherein $t_1$ is chosen such that a substantially stable behavior in a charging characteristic of the battery at the charge current is reached before the first voltage measurement.

3. The method as claimed in claim 1, wherein $t_1$ and $t_2$ are chosen such that the second voltage measurement is prior to reaching a substantially unstable behavior in the charging characteristic before a maximum charging voltage is reached.

4. The method as claimed in claim 1, wherein $t_1$ and $t_2$ are calculated from different percentages of C/I, wherein C is a nominal capacity of the battery and I is the charge current.

5. The method as claimed in claim 4, wherein $t_1$ is about 2% of C/I, and $t_2$ may be about 10% of C/I.

6. The method as claimed in claim 1, wherein the battery comprises a Nickel Metal Hydride Battery, a Nickel Cadmium Battery, a Lead Acid Battery, a Nickel Zinc Battery, or a Lithium Rechargeable Battery.

7. The method as claimed in claim 1, wherein the method further comprises calibrating an on-vehicle SOC integrator circuit of a hybrid EV or pure EV based on the determined SOC.

8. The method as claimed in claim 1, wherein the method comprises determining a first SOC value based on a voltage increase measured between the first and second voltage measurements, determining a second SOC value based on the voltage measured at the second voltage measurement, and applying a weighted averaging processing to obtain the SOC from the first and second SOC values.

9. The method as claimed in claim 1, wherein the measuring of the battery voltage and the battery temperature comprises utilizing on-vehicle gauges of a hybrid EV or pure EV and/or external gauges.

10. The method as claimed in claim 1, wherein the charging of the battery comprises utilizing an external current source and/or an on-vehicle current source for provision of the substantially constant charge current.

11. The method as claimed in claim 1, wherein the battery temperature is measured at the time of the first voltage measurement and/or at the time of the second voltage measurement.

12. A system for determining the state of charge (SOC) of a rechargeable battery, the system comprising
    a source for charging the battery using a substantially constant charge current, wherein the battery has an unknown SOC at the commencement of the charging;
    a measurement unit for measuring the battery temperature and for conducting a first measurement of the battery voltage at a time interval, $t_1$, from the start of the charging, and a second measurement of the battery voltage at a time interval, $t_2$, from the first measurement; and
    a processor unit for determining the SOC of the battery based on the charge current, the battery temperature and the first and second measurements.

13. The system as claimed in claim 12, wherein $t_1$ is chosen such a substantially stable behavior in a charging characteristic of the battery at the charge current is reached before the first voltage measurement.

14. The system as claimed in claim 12, wherein $t_1$ and $t_2$ are chosen such that the second voltage measurement is prior to reaching a substantially unstable behavior in the charging characteristic before a maximum charging voltage is reached.

15. The system as claimed in claim 12, wherein $t_1$ and $t_2$ are calculated from different percentages of C/I, wherein C is a nominal capacity of the battery and I is the charge current.

16. The system as claimed in claim 15, wherein $t_1$ is about 2% of C/I, and $t_2$ is about 10% of C/I.

17. The system as claimed in claim 12, wherein the battery comprises a Nickel Metal Hydride Battery, a Nickel Cadmium Battery, a Lead Acid Battery, a Nickel Zinc Battery, or a Lithium Rechargeable Battery.

18. The system as claimed in claim 12, wherein the processor unit determines a first SOC value based on a voltage increase measured between the first and second voltage measurements, determines a second SOC value based on the voltage measured at the second voltage measurement, and applies a weighted averaging processing to obtain the SOC from the first and second SOC values.

19. The system as claimed in claim 12, wherein the measurement unit comprises on-vehicle gauges of a hybrid EV or pure EV and/or external gauges.

20. The system as claimed in claim 12, wherein the source comprises a current source external to a hybrid EV or pure EV.

21. The system as claimed in claim 12, wherein the source comprises an on-vehicle current source.

22. The system as claimed in claim 12, wherein the measurement unit measures the battery temperature at the time of the first voltage measurement and/or at the time of the second voltage measurement.

* * * * *